United States Patent [19]
Jeddeloh et al.

[11] Patent Number: 5,819,076
[45] Date of Patent: *Oct. 6, 1998

[54] MEMORY CONTROLLER WITH LOW SKEW CONTROL SIGNAL

[75] Inventors: Joseph M. Jeddeloh, Minneapolis; Jeffrey J. Rooney, Red Wing; Richard F. Nicholson; Dean A. Klein, both of Lake City, all of Minn.

[73] Assignee: Micron Electronics, Inc., Nampa, Id.

[*] Notice: The term of this patent shall not extend beyond the expiration date of Pat. No. 5,692,165.

[21] Appl. No.: 882,559

[22] Filed: Jun. 25, 1997

Related U.S. Application Data

[63] Continuation of Ser. No. 526,988, Sep. 12, 1995, Pat. No. 5,692,165.

[51] Int. Cl.⁶ ........................................... G06F 1/04
[52] U.S. Cl. .......................................... 395/552; 711/100
[58] Field of Search .................................. 395/551, 552; 711/100, 101, 104

[56] References Cited

U.S. PATENT DOCUMENTS

| | | | |
|---|---|---|---|
| 5,479,647 | 12/1995 | Harness et al. | 395/550 |
| 5,572,722 | 11/1996 | Vogley | 395/555 |
| 5,577,236 | 11/1996 | Johnson et al. | 395/551 |
| 5,692,165 | 11/1997 | Jeddeloh et al. | 395/551 |

*Primary Examiner*—Dennis M. Butler
*Attorney, Agent, or Firm*—Dorsey & Whitney LLP

[57] ABSTRACT

An apparatus and a method are provided for delaying or skewing a control signal provided to an electronic device such as a memory device with an alignment delay, such that the overall delay associated with the alignment delay and the propagation delay associated with outputting the control signal to the electronic device substantially equals one or more integral cycles of a clock signal. As a result, the control signal received at the electronic device is substantially aligned with the clock signal. This results in synchronizing or realigning the asynchronously-generated control signal back into a synchronous environment. The apparatus and method have unique applicability when used in memory controllers and the like for handling memory accesses with one or more memory devices, in particular with memory devices having enhanced memory transfer modes or higher transfer speeds, where even a small amount of skew between a control signal and a clock signal may significantly degrade performance. A propagation delay, or delay factor, associated with outputting the control signal to the electronic device is computed based upon the process factor for the apparatus, as well as any temperature and/or voltage variations. In addition, the delay factor may be modified dynamically to account for real-time voltage and/or temperature variations.

10 Claims, 7 Drawing Sheets

PRIOR ART
FIG. 1
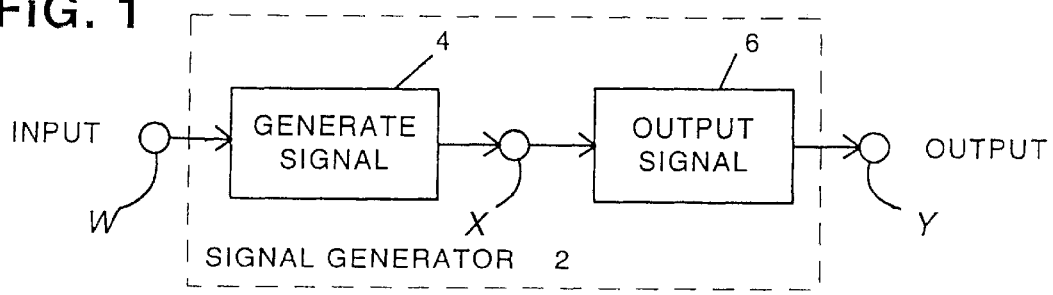
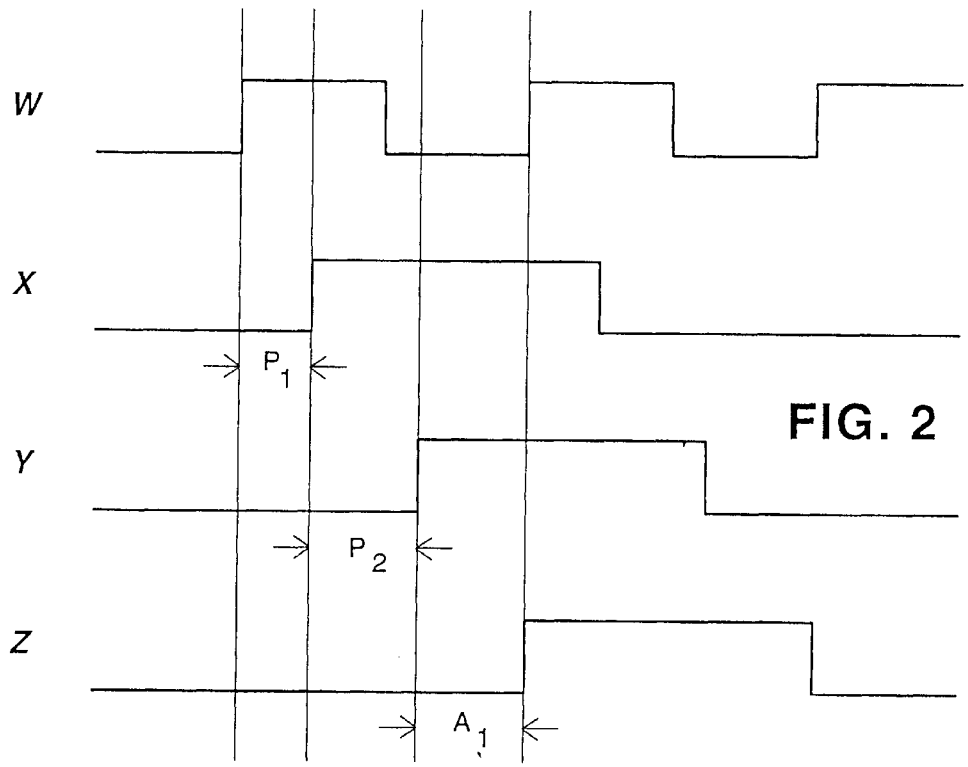
FIG. 2
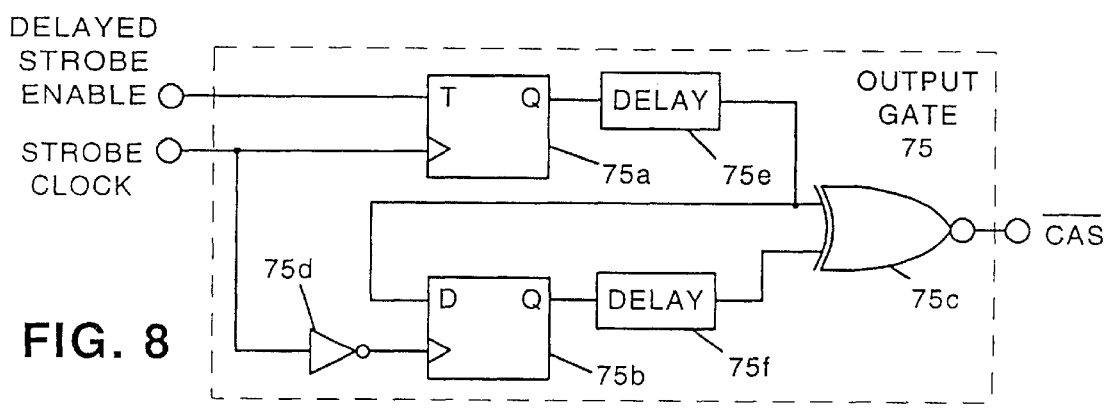
FIG. 8

MEMORY CONTROLLER WITH LOW SKEW CONTROL SIGNAL

This is a continuation of application Ser. No. 08/526,988, filed Sep. 12, 1995, now U.S. Pat. No. 5,692,165.

This application contains similar subject matter to "Method for Aligning Control Signal and Clock Signal," filed on even date herewith, Ser. No. 08/881,918.

FIELD OF THE INVENTION

The invention is generally directed to a memory controller for coordinating transfer to and from one or more memory devices across a bus. More particularly, the invention is directed to a memory controller which provides a low skew control signal for coordinating the memory transfer with the memory devices across the bus.

BACKGROUND OF THE INVENTION

Signal skew poses many concerns in high speed data processing environments. By "skew", what is meant is a time shift in a signal, generally relative to a clock or other signal, which results in the transitions between individual data bits in a digital signal stream which are offset in time from the transitions in the clock.

A signal may be skewed, or out of alignment, relative to another signal either between individual integrated circuit chips, or within different areas of the same chip. This often occurs due to signal propagation delays along transmission lines and through integrated circuitry. A skewed signal poses a concern because it may result in errors due to missed data or register ripple-through. Often, to account for skew, one or more "wait states", or full clock cycles, may be added to a signal to ensure that the data is valid However, the insertion of wait states into signals slows down processing and results in a slower information transfer.

Signal skew is conventionally handled in two manners. First, signal skew between different integrated circuit chips may be handled by low skew clock distribution networks. Often the skew between different chips is due to different transmission line lengths between a common signal source and the chips. This form of skew is often handled by making the signal lengths between the chips and the signal source the same, and/or by measuring the delays to the different chips and compensating for the delays using phase locked loops or inserted delays. However, it has been found that feedback systems for measuring and compensating for transmission delays may also introduce some skew. In addition, many of these systems do not account for signal propagation delays through the chips themselves.

Second, signal skew may be handled through internal chip clock synchronization to align signals throughout a chip. For example, one particular application which requires low skew signals is a memory controller, which coordinates data transfers to and from one or more memory devices across a bus. Memory controllers typically provide control signals to control the memory devices to receive or transmit data across the bus, for example to a processor or other controlling or peripheral devices.

The control signals generated by a conventional memory controller, however, often have at least some skew relative to the system clock which drives the bus. This is because some logic components are always downstream of a clock input when producing output signals in a chip, often resulting in a minimum of about 7–10 nanoseconds of skew. Often, conventional memory controllers must insert one or more wait states into the control signals to handle the access delays associated with the memory devices.

Further, as memory systems get faster, skew becomes more significant relative to the clock cycle, and the risk of errors increases. For example, memory devices such as DRAMs are capable of operating at 66 MHz or more (i.e., with 15 ns clock cycles). Other memory devices such as SRAMs may run even faster. With conventional memory controllers providing a minimum of 7–10 nanoseconds of skew in the control signal, the skew in the control signals may thus represent up to 67% of the total clock cycle.

Synchronous DRAMs are another option for minimizing control signal skew relative to a bus, as they receive a system clock directly and use the clock to gate control signals from a memory controller. This typically minimizes the propagation delay downstream of the gates in the memory devices, thereby minimizing the skew of the control signals. However, synchronous DRAMs are often not particularly desirable because space on memory devices is very expensive both economically and performance-wise, so any additional control circuitry on a memory device is generally discouraged.

Therefore, a substantial need exists for a memory controller which is capable of generating low skew control signals to control memory devices.

In addition, we have found that a unique concern exists with regard to signal skew in applications which utilize memory devices having enhanced memory transfer modes such as page mode and extended data out (EDO) mode, where memory addresses located within the same page or column of a memory device may be transferred without having to repeatedly send full address information to the device for each memory location. In particular, we have found that the higher operating speeds and enhanced operating modes of many memory devices are beyond the capabilities of many conventional memory controllers. Since less delay is required when accessing multiple addresses in such memory devices, wait states, or slower transfer rates, are often the only available alternatives for many conventional memory controllers.

Therefore, in view of our realization of the inadequacy of conventional memory controllers in handling the particular concerns associated with the use of high speed memories operating in enhanced transfer modes, a substantial need has also arisen for a memory controller which is capable of generating low skew control signals to control such high speed enhanced mode devices.

SUMMARY OF THE INVENTION

The invention addresses these and other problems associated with the prior art in providing an apparatus which delays or skews a control signal to an electronic device such as a memory device relative to a clock signal from a system clock with an alignment delay, such that the overall delay associated with the alignment delay and the propagation delay associated with outputting the control signal to the electronic device substantially equals one or more integral clock cycles. As a result, the control signal received at the electronic device is substantially aligned with the clock signal, and therefore also with the bus to which the electronic device is connected. In effect, this results in synchronizing or realigning the asynchronously-generated control signal back into a synchronous environment. This is in contrast to conventional low skewed clock distribution and internal chip synchronization systems which fully remove signals from a synchronous domain and operate upon them asynchronously.

The invention has unique applicability with memory devices having enhanced memory transfer modes such as the EDO and page modes provided on many commercially available memory devices, as well as in higher speed memory devices, since in each of these applications, even a small amount of skew between a control signal and a clock signal may significantly degrade the overall performance of the system. Another enhanced operating mode which has become available, the Burst Extended Data Out (BEDO) transfer mode, has been found to be particularly suitable for use with preferred embodiments of the invention. The BEDO transfer mode permits bursts of memory addresses to be transferred 1-1-1 (i.e., with one address transferred per clock cycle). After loading initial memory address information, a memory controller may provide a strobe control signal to the memory device each clock cycle, and the memory device will perform the read or write transfer at the current address, then automatically increment the address pointer to point to the next memory address in the device. By virtue of the extremely low skew realized in preferred embodiments of the invention, we have been able to address the particular problems associated with memory devices implementing the BEDO transfer mode.

Moreover, in preferred embodiments of the invention, the added delay to a control signal for the purposes of realigning it with a clock signal will not substantially affect the performance of the overall system, since the initial delay inserted into the control signal will generally occur during the initial access time for the memory devices.

The preferred embodiments of the invention also address several additional concerns which are raised as a result of the practical difficulties in determining the propagation delay associated with outputting a control signal. In these embodiments, a propagation delay, or delay factor, for the memory controller may be calculated to determine the suitable alignment delay inserted into the control signals to realign them with the system clock.

In determining a delay factor, a process factor for the controller may be determined, which is related to the relative speed of the controller, and which varies based upon the particular properties of the materials used to construct the actual controller chip. Further, in operation, temperature and voltage variations will often modify the overall propagation delay inherent in an integrated circuit, and accordingly, the delay factor may be modified dynamically to account for real-time voltage and/or temperature variations.

Therefore, in accordance with one aspect of the invention, an apparatus is provided for controlling a memory in response to an access request from a processor, the apparatus and the memory each electrically coupled to the processor across a bus of the type having information transferred thereon that is aligned with a clock signal, the memory of the type for receiving at least one strobe control signal. The apparatus includes a memory control circuit for providing control signals to the memory in response to an access request, wherein the control signal generating circuit generates a strobe enable signal; and a strobe generating circuit, electrically coupled to receive the strobe enable signal and the clock signal, for providing a strobe control signal to the memory. The strobe generating circuit includes a first delay for delaying the clock signal by a first alignment delay value to generate a strobe clock signal; a second delay for delaying the strobe enable signal by a second alignment delay value to generate a delayed strobe enable signal; and an output device, electrically coupled to the memory, for gating the strobe clock with the delayed strobe enable signal to thereby provide the strobe control signal to the memory. The first alignment delay value is selected to align the strobe control signal with the clock signal and the second alignment delay value is selected to align the delayed strobe enable signal with the strobe clock.

In accordance with another aspect of the invention, an apparatus is provided for controlling at least one electronic device electrically coupled to a bus which is clocked by a clock signal, the electronic device of the type for receiving at least one control signal from the apparatus. The apparatus includes control means for generating a control signal with a propagation delay associated therewith which is related to the skew in the control signal relative to the clock signal; alignment means for skewing the control signal with an alignment delay to generate a skewed control signal, wherein the alignment delay has a value such that the sum of the propagation delay and the alignment delay is related to at least one integral cycle of the clock signal; and output means for outputting the skewed control signal to the electronic device; whereby the skewed control signal is aligned with the clock signal.

According to a further aspect of the invention, a method is provided for aligning a control and a clock signal received by an electronic device, wherein the control signal of the type which is skewed relative to the clock signal by a propagation delay associated with outputting the control signal. The method includes the steps of determining an alignment delay having a value that, when summed with the propagation delay of the control signal, is related to at least one integral cycle of the clock signal; delaying the control signal with the alignment delay to generate a skewed control signal; and outputting the skewed control signal to the electronic device such that the skewed control signal is aligned with the clock signal at the electronic device.

These and other advantages and features, which characterize the invention, are set forth in the claims annexed hereto and forming a further part hereof. However, for a better understanding of the invention, and the objectives and advantages attained by its use, reference should be made to the drawing, and to the accompanying descriptive matter, in which there is described a preferred embodiment of the invention.

BRIEF DESCRIPTION OF THE DRAWING

FIG. 1 is a functional block diagram illustrating the operation of a conventional signal generator.

FIG. 2 is a timing diagram illustrating the delays inherent in the generator of FIG. 1, as well as the operation of preferred embodiments of the invention in handling these delays.

FIG. 8 is a functional block diagram of the output gate of FIG. 6.

DETAILED DESCRIPTION OF THE PREFERRED EMBODIMENTS

Figure 3:
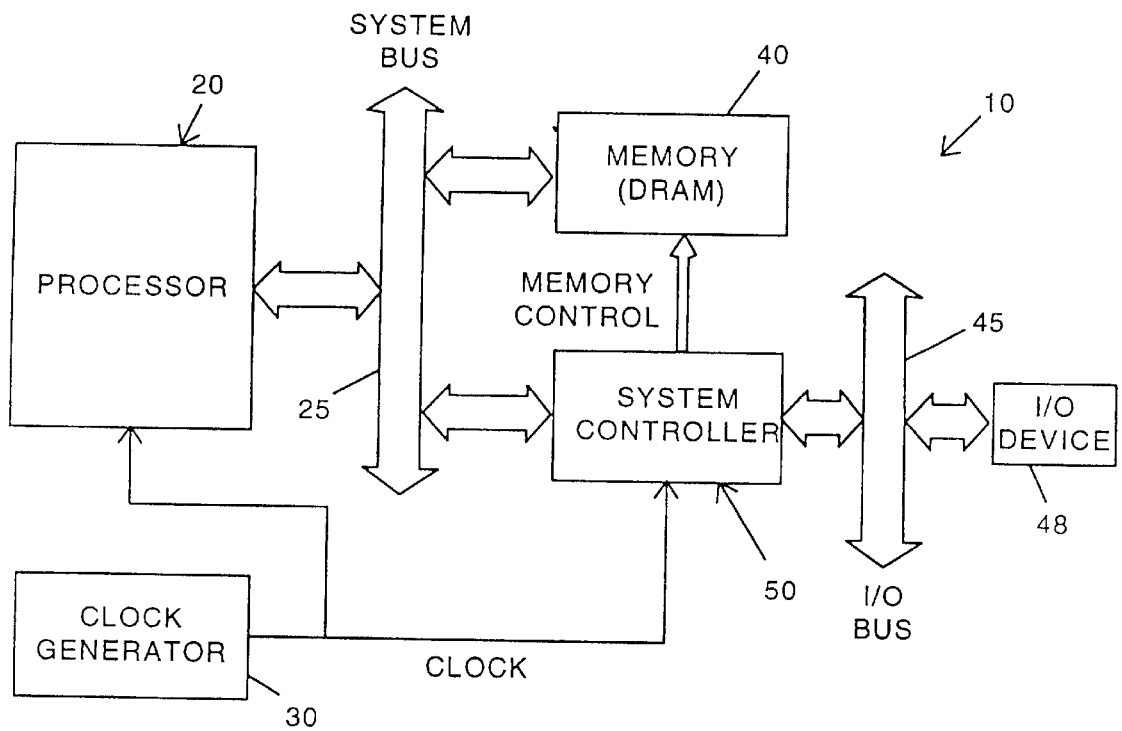
FIG. 3 is a functional block diagram of a processing system showing a preferred system controller utilizing one preferred apparatus consistent with the principles of the invention.

Prior to discussing the preferred embodiments of the invention, a brief discussion of the principles of operation of the invention is provided. In particular, to describe the operation of the invention, a basic explanation of the delays inherent in signal generation is provided.

The invention is generally directed to realigning a skewed first signal with a second signal such that the first signal is substantially aligned with the second signal when the first and second signals are received at a common destination. The second signal in the preferred embodiments is a clock signal, or more particularly, any signal which is aligned with the clock signal, e.g., data and address signals on a bus. However, the second signal may also be skewed with respect to the clock signal, whereby any delays added to the first signal to align it with the second signal may also address the skew of the second signal.

The common destination may be a circuit or specific logic device which preferably receives both the first and second signals such that the first and second signals are aligned with one another (i.e., if both signals are assumed to transition at a certain time, such as at a clock cycle leading edge, the transitions in both signals will occur substantially simultaneously). In the preferred embodiments the common destination is a memory device which is coupled to the bus. The first signal in the preferred embodiments is a control signal which is used to control the memory device, and through the operation of the preferred embodiments, the control signal is substantially aligned with the clock signal, and thus, is also aligned with the bus, when it is received by the memory device. It will be appreciated, however, that the invention also has applicability to other types of first and second signals and common destinations than those disclosed herein.

The first signal may be skewed relative to the second signal for a variety of reasons, most of which emanate from the propagation delays inherent in integrated circuitry. Any logic gates or transmission lines through which the first signal is passed may introduce delays into the signal which "skew" it relative to the second.

For example, in convention signal generators, e.g., signal generator 2 shown in FIG. 1, there are several delays that may be inherent in the generation of a signal using integrated circuitry. First, there are delays associated with actually generating a signal, which may include any reception and decoding of a request to generate the signal, as well as the actual generation of the signal. This is illustrated by the GENERATE SIGNAL block 4 shown in FIG. 1. One of the inputs to this block may be a clock signal to which the generated signal is to be aligned.

As an illustration, FIG. 2 shows the generation of a first signal which is asserted high for one cycle of a clock signal. Line W shows the clock signal input to block 4 at point W of FIG. 1, which is considered the second signal in this example. Line X of FIG. 2 shows the generated signal at point X in FIG. 1 as it is output from block 4. The "skew" of the signal is related to the propagation delay $P_1$ associated with generating the signal.

In addition to delays in generating a signal, there may be delays associated with outputting a signal once it is generated, such as any output gates or other circuitry disposed between the GENERATE SIGNAL block 4 and the common destination of the signal. This is illustrated by the OUTPUT SIGNAL block 6 shown in FIG. 1. The additional propagation delay $P_2$ associated with outputting the signal is shown in FIG. 2 by Line Y, which corresponds to the output of block 6 at point Y of FIG. 1.

It will be appreciated that the signal generator 2 may take several clock cycles to generate and/or output a signal. The propagation delays for the purposes of the invention are not measured from the beginning of the signal generation; rather, they are measured from the latest (or most recent) clock cycle to which the generated signal is preferred to be aligned. Also, it will be appreciated that the magnitudes of the propagation delays may vary depending upon the particular design of the signal generator, and one or both of the delays $P_1$ or $P_2$ may be negligible. For example, a clock signal may be provided directly to the OUTPUT SIGNAL block 6 to attempt to align the signal with the clock signal at this block, thereby minimizing any propagation delays associated with the GENERATE SIGNAL block 4.

Preferred embodiments of the invention realign a skewed signal by adding an alignment delay which, when summed with the propagation delays associated with generating and/or outputting the signal, results in an overall delay which realigns the first signal with the second signal. When the second signal is a clock signal, or is aligned with a clock signal, the overall delay will therefore be substantially equal to one or more integral cycles of the clock signal. For example, as shown in Line Z of FIG. 2, the insertion of an alignment delay $A_1$ results in a signal which is realigned with the clock signal shown in Line A.

Now turning to a discussion of the preferred embodiments of the invention, wherein like parts are denoted by like numbers throughout the several views of the Drawing, FIG. 3 is a functional block diagram of a processing system 10 consistent with the principles of the invention. System 10 represents many of the basic components in a standard PC computer system, including a processor 20, a bus 25, a clock generator 30, a memory 40 and a system controller 50.

Processor 20 controls the overall operation of system 10, and is preferably one of the 80×86-family of processors made by Intel and others. Most preferably, processor 20 is an Intel Pentium™ microprocessor, although other processors, including the 68000-family and PowerPC™-family of microprocessors, may also be used.

Processor 20 is coupled to various supporting circuitry, including a memory 40 and a system controller 50, through a bus 25. The bus is driven by processor 20 in a manner which is known in the art, using a CLOCK signal generated from a conventional clock generator 30. The bus may operate on the same frequency as the processor, or alternatively, may be coupled through a divider network to operate at a fraction of the speed of the processor. A bus typically includes a plurality of data and address lines, and may be multiplexed. The preferred bus 25 for use with a Pentium™ microprocessor includes 32 address lines and 64 data lines, and is run at a speed of 66 MHz or more.

A memory 40 is coupled to processor 20 across bus 25. Memory 40 in the preferred embodiment is implemented using a plurality of dynamic random access memory devices (DRAMs) provided in multi-chip (e.g., SIMM or SIP) modules, and is used as the primary work space for processor 20.

The preferred memory devices are BEDO DRAMs (e.g., Part No. MT4LC4M4G6 4MB×4 DRAMs) manufactured by Micron Technologies, Inc., which are capable of running in a BEDO transfer mode at clock speeds of up to 66 MHz. The BEDO transfer mode permits bursts of memory addresses to be transferred 1-1-1 (i.e., with one address transferred per clock cycle). After loading initial memory address information, a memory controller may provide a strobe control signal to the memory device each clock cycle, and the memory device will perform the read or write transfer at the current address, then automatically increment the address pointer to point to the next memory address in the device. In the preferred embodiments, burst packets of four adjacent memory locations are transferred at a time in this manner.

Preferred BEDO memory devices suitable for use with preferred embodiments of the invention are discussed; for example, in the following U.S. patent applications, all assigned to Micron Technologies, Inc.: Ser. No. 08/370,761 filed Dec. 23, 1994 and entitled "Burst EDO Memory Device"; Ser. No. 08/386,894 filed Feb. 10, 1995 and entitled "Burst EDO Memory Device with Maximized Cycle Timing"; Ser. No. 08/386,563 filed Feb. 10, 1995 and entitled "Burst EDO Memory Device Having Pipelined Output"; and Ser. No. 08/455,095 filed May 31, 1995 and entitled "Burst Mode Block Write". The disclosures of all of these applications are hereby incorporated by reference herein. However, it will be appreciated that other random access memories such as DRAMs and other SRAMs, particularly those with enhanced data transfer modes, may also be used.

While the preferred system 10 is a main processing and memory system for a PC computer system, it will be appreciated that the principles of the invention may apply to other types of systems. For example, processor 20 may be any type of microprocessor or microcontroller, and may even be a controller for a device driver which runs independently of the main processing system of a computer, e.g., a video or device driver. Also, bus 25 may represent any type of bus found in a computer system, including a main system bus, a dedicated memory bus, a local bus, a video bus, etc. Furthermore, memory 40 may be any type of memory system, including main memory, device buffer memory, video memory, on-chip memory, cache memory, etc., and may be implemented with any type of memory device, including volatile memories such as DRAMs and SRAMs; non-volatile memories such as ROMs, EPROMs and EEPROMs; flash memories; etc. In addition, while the preferred processing system 10 is a PC-based system, it will be appreciated that the principles of the invention may be applied to other applications, including minicomputer systems, mainframe systems, multiprocessor systems, application-specific systems, etc.

System controller 50 is included in processing system to provide control over memory 40 in response to a memory access request received by the controller. Controller 50 coordinates the transfer of data across bus to and from memory 40 using specialized control signals provided to the memory. Controller 50 is also connected to bus 25 to receive the memory access requests from processor 20. In addition, system controller 50 may also optionally include the ability to handle memory requests across multiple buses, e.g., over a separate I/O bus 45 for connecting to peripheral components (e.g., I/O device 48) which may be a video driver, a mass storage device, etc. Accordingly, system controller 50 also preferably includes the ability to handle and schedule multiple requests from different buses.

System controller 50 is preferably implemented as an application specific integrated circuit (ASIC) device. The description which follows provides an explanation of the functional components of controller 50 necessary to control memory 40 consistent with the principles of the invention. It will be appreciated, however, that construction of an ASIC device to implement these functional components is a standard process which is well within the skill of one of ordinary skill in the art. Accordingly, the actual low level layout and description of the preferred system controller is not necessary for an understanding of the invention and will not be discussed herein.

In addition, it will be appreciated that while the preferred device is an ASIC device, one or more of the functions implemented by the device may be incorporated into multiple devices, either ASIC or off-the-shelf logic devices, and may be partly or wholly implemented in software and run by processor 20 or a separate processor if desired.

Figure 4:
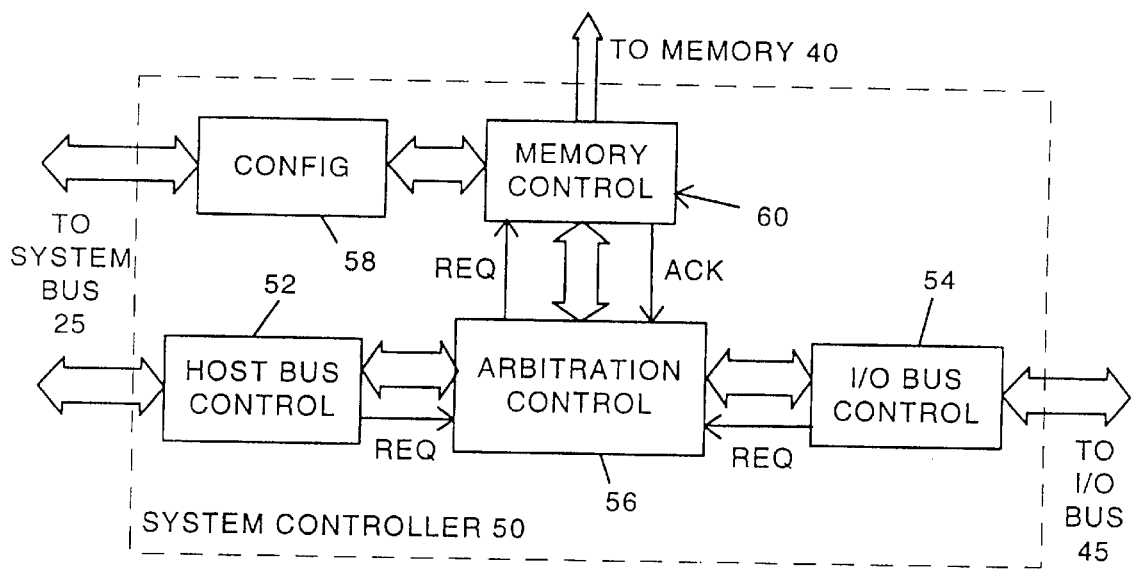
FIG. 4 is a functional block diagram of the preferred system controller of FIG. 3.

FIG. 4 shows a block diagram of system controller 50. The controller includes an arbitration control system to decode and schedule memory access requests received from buses 25 and 45. A host bus control block 52 is electrically coupled between system bus 25 and an arbitration control block 56. Block 52 handles data communication with bus 25, decodes the memory access requests and passes these requests to arbitration control block 56. A separate request line REQ is used to indicate when an access request has been received. Similarly, I/O bus control block 54 handles data communication with bus 45, and provides decoded memory access requests to arbitration control block 56, signaling a valid request with a separate REQ line.

Arbitration control block 56 schedules the access requests received from blocks 52 and 54, resolving conflicts between any simultaneous requests on both buses. Block 56 passes valid requests to memory control block 60 for initiating a memory access with memory 40. Separate REQ and ACK lines are electrically coupled between blocks 56 and 60 to indicate when a memory access request is pending, and when it has been completed.

Blocks 52–56 all represent conventional functions found on conventional system controllers known in the art. For example, one suitable system controller which provides the aforementioned functions is the 82C590 system controller manufactured by VLSI Technology Inc. However, other system controllers, as well as other functions, may also be used. As the functions in blocks 52–56 represent conventional functions, they are not discussed in detail herein.

System controller 50 also includes a configuration block 58 ("config") which is coupled to system bus 25 to handle any read/write operations between processor 20 and a number of registers found within memory control block 60. The purpose of block 58 is to perform general handshaking and register access control to enable processor 20 to pass information to and from memory control block 60. The function of block 58 will be discussed in greater detail below.

Figure 5:
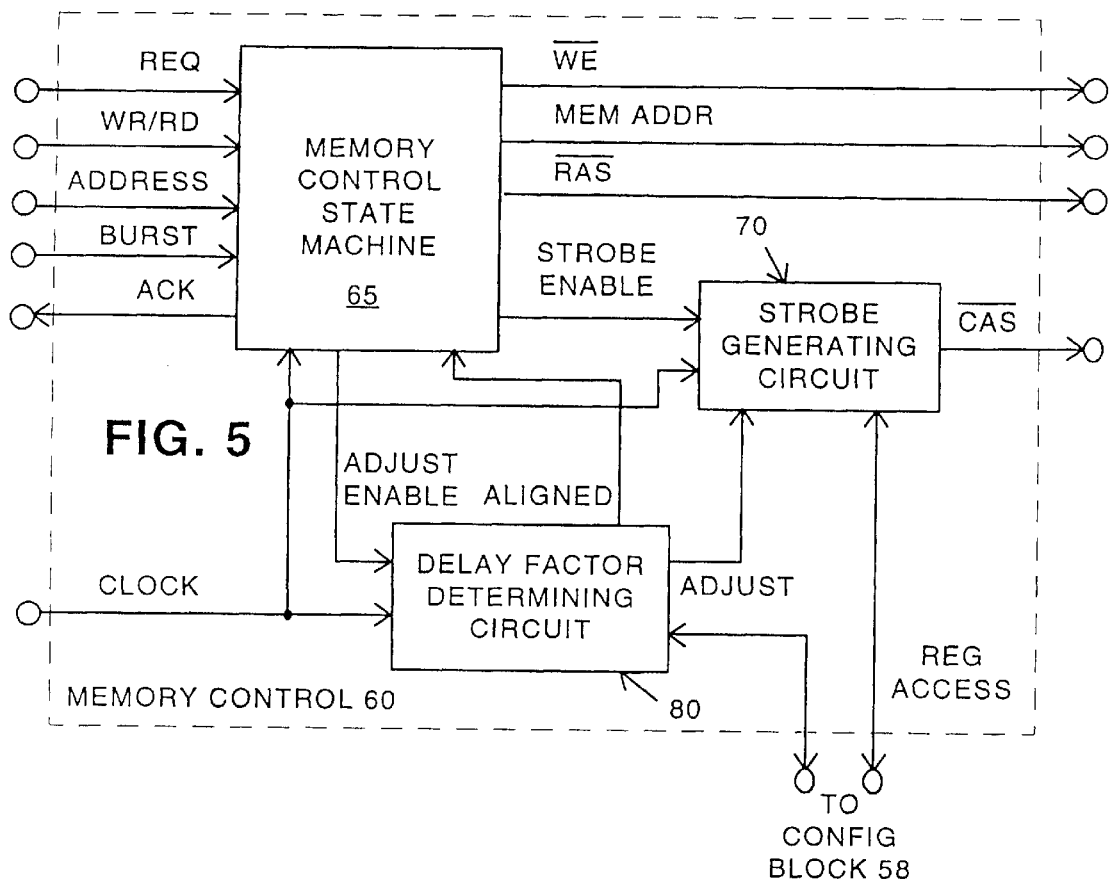
FIG. 5 is a functional block diagram of the memory control block of FIG. 4.

Memory control block 60 generates the control signals necessary to control memory 40 to transfer information across bus 25. FIG. 5 shows this block in greater detail, in particular showing a memory control state machine 65, a strobe generating circuit 70, and a delay factor determining circuit 80.

Many of the functions of memory control block 60 are generally known in the art, and are typically implemented in memory control circuit or state machine 65. The state machine handles memory access requests and generates the appropriate control signals at the appropriate times to handle the access. The type of data that is received by state machine 65, as well as the types and time sequences of control signals output by the state machine, will vary depending upon the particular processor which generates the request, as well as the particular memory devices used to implement memory 40. Control signal protocols for specific memory devices are well known in the art, and accordingly the generation of specific control signals for coordinating memory control are discussed herein only to the extent that they differ from conventional memory control protocols. As an example, the aforementioned 82C590 system controller includes a state machine which is suitable for receiving and decoding memory access requests from an Intel 80×86 microprocessor and generate suitable control signals for use with conventional 80×86-compatible DRAMs.

The preferred state machine 65 receives a number of inputs related to the memory access requests upon which it will act. First, state machine 65 receives the REQ handshaking line from arbitration control block 56 and passes back the ACK handshaking line. In addition, a WR/RD line is received to determine whether an access request is for a read or write operation. A plurality of ADDRESS lines provide the specific memory address within the memory to access. Also, a BURST line is received to indicate whether a transfer is for a single memory address, or is for a burst, or other enhanced mode, transfer.

In response to a memory access request, the state machine will generate a number of control signals for controlling memory 40. $\overline{WE}$ is an active low control signal which indicates whether a request is a read or write operation. The MEM ADDR control signals are multiplexed memory address lines for providing row or column address information to the memory devices. An active low row address strobe signal ($\overline{RAS}$) is used to indicate to a memory device that the address found on the MEM ADDR lines is to be loaded into the row address buffer. Each of these control signals is preferably provided directly to the memory devices, and without any alignment circuitry that will be discussed below. The generation of these signals is conventional in nature.

A conventional state machine would also generate an active-low column address strobe ($\overline{CAS}$) signal, or STROBE CONTROL signal, which is primarily used to signal to a memory device that the memory address on the MEM ADDR lines is to be used to load a column address buffer. In addition, in burst or other enhanced transfer modes, the $\overline{CAS}$ signal may also be used to request another memory transfer if an auto-incrementing address buffer is enabled.

In particular, when operating in a BEDO transfer mode, once the row and column addresses have been loaded into the memory devices with the starting address, four adjacent memory addresses may be accessed by pulsing the $\overline{CAS}$ signal four times. However, as described above, with conventional memory controllers, a problem may exist at higher transfer rates due to a skew of the $\overline{CAS}$ signal relative to the bus and the system clock signal.

Accordingly, in the preferred embodiments of the invention, state machine 65 operates instead as a strobe enabled generating circuit, generating a STROBE ENABLE signal (or more specifically, a $\overline{CAS}$ ENABLE signal) which is delayed as described below to provide a low skew $\overline{CAS}$ signal to the memory devices that is substantially aligned with the clock signal and the bus. In addition, as will be described below, state machine 65 also provides an ADJUST ENABLE signal to update the status of the alignment circuitry to compensate for any temperature/voltage variations on a chip when no memory transfers are being performed.

The STROBE ENABLE signal is used to gate a STROBE CLOCK signal to provide one or more aligned pulses as the STROBE CONTROL ($\overline{CAS}$) signal. In a normal mode access (where the BURST line is not asserted) the STROBE ENABLE signal will be one cycle in duration such that one pulse is output as the STROBE CONTROL signal. However, in a burst mode access (where BURST is asserted), the STROBE ENABLE is preferably four cycles in duration to provide four pulses as the STROBE CONTROL signal, one per clock cycle, to transfer four adjacent memory addresses in the memory, which is compatible with the BEDO access mode in the preferred processing system 10. However, it will be appreciated that the number of pulses in the strobe control signal may vary depending upon the number of memory transfers desired and the particular transfer protocol used. For example, an entire page or column of memory could be transferred 1-1-1 if enough pulses were provided.

In the preferred memory control block 60, two additional blocks are used that are not implemented in a conventional memory controller. The first of these blocks is a strobe generating circuit 70, which is shown in greater detail in FIG. 6. This circuit receives the STROBE ENABLE signal from state machine 65 and a CLOCK signal from the clock generating circuit, and outputs the STROBE CONTROL signal ($\overline{CAS}$) which has been delayed a sufficient period of time to align the signal with the bus and CLOCK signal at the memory devices. Circuit 70 also receives REG ACCESS signals from configuration block 58 of FIG. 4 to permit processor 20 to access the registers 73 and 77 within the circuit. In addition, circuit 70 receives an ADJUST signal from the delay factor determining circuit 80 (FIG. 5) to adjust the values in the registers due to voltage or temperature variations.

Circuit 70 includes a strobe clock generating circuit 72 for generating a STROBE CLOCK signal which is basically a delayed version of the CLOCK signal. Circuit 72 includes a first register 73 which is used to store a first delay count which corresponds to the amount of delay to insert into the CLOCK signal to generate the STROBE CLOCK signal. Register 73 is preferably configured as a register/counter, and accordingly includes inputs for accepting the REG ACCESS signals from configuration block 58 to enable processor 20 to write new values into the register. The access signals include data inputs, and an enable signal for loading the register with a delay count value provided on the data inputs by configuration block 58

Register 73 also includes an ADJUST input received from circuit 80 to adjust the count values stored therein in response to temperature or voltage variations. The ADJUST signal is preferably a pair of signals INC and DEC, which are used to respectively increment or decrement (i.e., count up or count down) the value in the register. The operation of these signals will be discussed below.

The output of register 73 is fed into a programmable delay 74 as a selection signal for controlling the programmable delay to insert a fixed delay into the CLOCK signal received at its signal input. The output of programmable delay 74 is the STROBE CLOCK signal, which is essentially the CLOCK signal delayed by a fixed amount.

Figure 7:
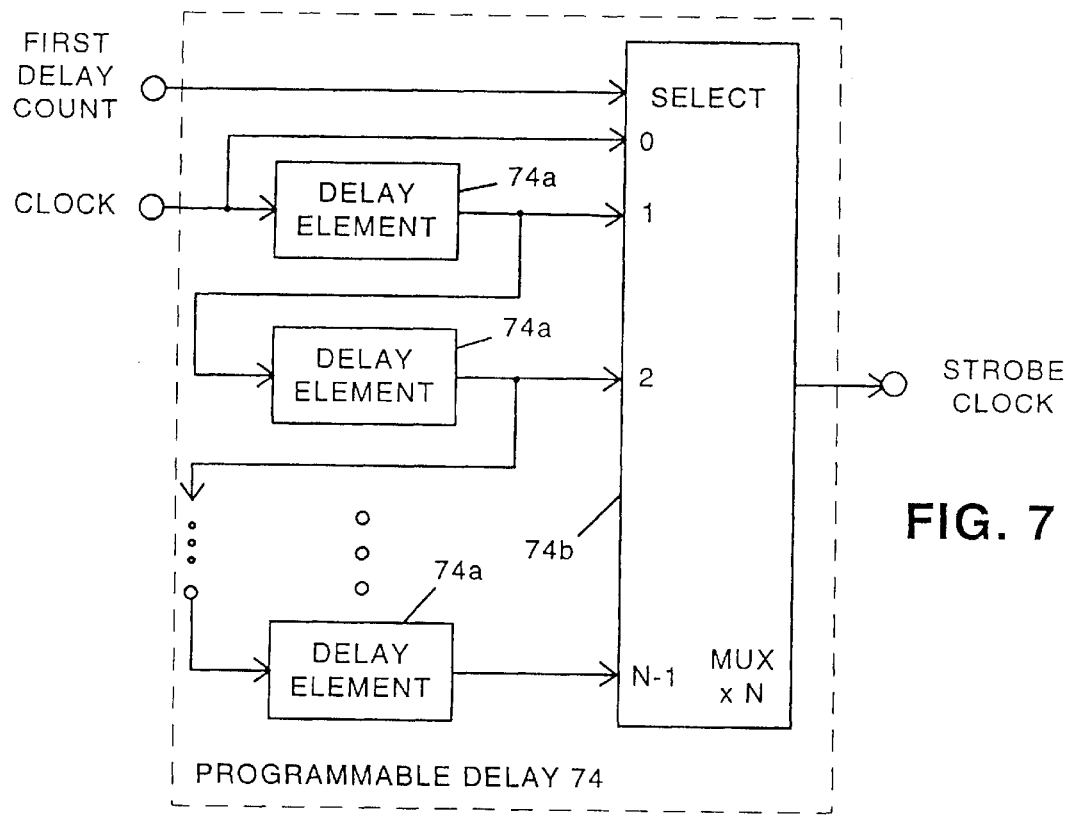
FIG. 7 is a functional block diagram of the first programmable delay of FIG. 6.

Programmable delay 74 may be implemented in a number of fashions. For example, FIG. 7 shows one implementation whereby a plurality of delay elements 74a are connected in series, with the output of each delay element connected to the input of the next element in the chain. The input of the first delay element in the chain receives the CLOCK signal. In addition, the output of each delay element is fed into an input (1, 2, etc., up to N−1) in a N:1 multiplexer 74b. The multiplexer also includes a SELECT input which receives the first delay count value from register 73. The output of multiplexer 74b is the STROBE CLOCK signal, which represents the signal at the selected input I (where I=0 to N−1) of the multiplexer. Therefore, programmable delay 74 will insert a delay into the clock signal which is equal to the delay per delay element multiplied by the value provided to the SELECT input by register 73.

Each delay element 74a is identically configured to insert a fixed delay into its respective input signal. Each delay element may be implemented by any electronic configuration which inserts a delay into a signal, be it capacitive, inductive, etc. More preferably, however, each delay element is one or more logic gates whose net output is simply a delayed version of the input. For example, each delay element may be implemented as an even number of inverter gates sufficient to provide the desired delay. Other combinations of logic elements may also be used.

Each delay element preferably provides a fixed delay of 250 picoseconds to one nanosecond, most preferably 800 picoseconds. The number of delay elements used in programmable delay 74 will depend upon the clock cycle and the relationship of the delay per element to the clock cycle. For example, with a 15 nanosecond clock cycle and an 800 picosecond delay per delay element, 19 delay elements and a 32 input multiplexer may be used to provide the desired range of delays.

Returning to FIG. 6, strobe generating circuit 70 also includes a delayed strobe enable generating circuit 76 which includes a register 77 and programmable delay 78.

Second register 77 stores a second delay count, which corresponds to the amount of delay to insert into the STROBE ENABLE signal to generate the required DELAYED STROBE ENABLE signal. Register 77 is preferably identically configured to register 73 as a register/counter, receiving REG ACCESS signals from configuration block 58 to enable the register to be loaded with the second delay count, and receiving an ADJUST input from circuit 80 to increment or decrement the value in the register to compensate for voltage or temperature variations.

Register 77 outputs to the SELECT input of programmable delay 78, which is preferably identically configured to programmable delay 74 shown in FIG. 7. However, instead of receiving the CLOCK signal as its signal input, programmable delay 78 receives a STROBE ENABLE signal from state machine 65. Accordingly, through selection of the appropriate value in register 77, the STROBE ENABLE signal is delayed a fixed period of time to generate the DELAYED STROBE ENABLE signal.

Programmable delay 78 may be identically configured to delay 74. Alternatively, a different number of delay elements, or differing delays per delay element, may be used.

Figure 6:
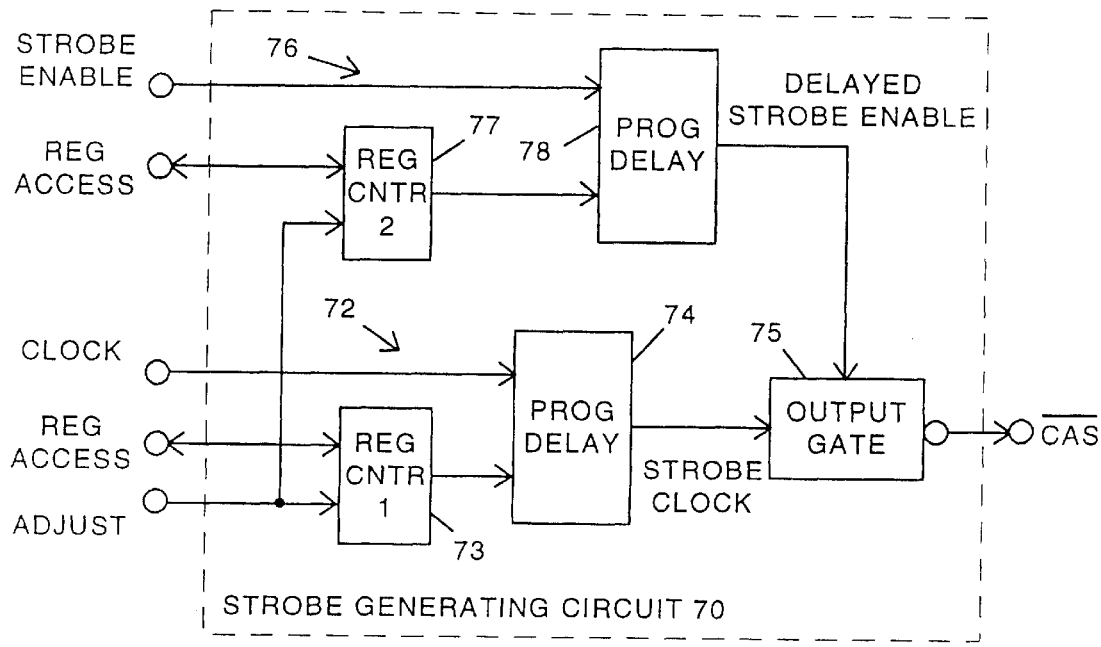
FIG. 6 is a functional block diagram of the strobe generating circuit of FIG. 5.

The STROBE CLOCK signal output from programmable delay 74, and the DELAYED STROBE ENABLE signal output from programmable delay 78, are each fed into an output device or gate 75. Gate 75 receives the STROBE CLOCK signal at its SIGNAL input, and receives the DELAYED STROBE ENABLE signal at its ENABLE input. Output gate 75 essentially outputs the signal at its SIGNAL input whenever its output is enabled by the ENABLE input. As shown in FIG. 6, gate 75 is preferably an active low output 9 such that the output signal, the STROBE CONTROL signal ($\overline{CAS}$), is active low consistent with most memory control protocols.

Output gate 75 may be implemented in a number of manners. For example, output gate 75 may be configured as a simple NAND gate, receiving the STROBE CLOCK and DELAYED STROBE ENABLE signals, and providing an active low output. Alternatively, gate 75 may be a latch coupled with an inverter. Of course, if an active high output signal were desired, no inversion of the signal input to the gate would be required.

Gate 75 may also include additional pulse shaping circuitry to better tailor the signal for receipt by the memory devices. For example, FIG. 8 shows a preferred implementation of gate 75. In this implementation a pair of flip flops 75a and 75b are used to restore the $\overline{CAS}$ signal to a square wave.

Flip flop 75a is an edge-triggered T flip flop, with its T input coupled to the DELAYED STROBE ENABLE signal, and the edge triggered clock input coupled to the STROBE CLOCK signal. The Q output of flip flop 75a is fed into the D input of D-type flip flop 75b. The edge triggered clock input of flip flop 75b is coupled to the STROBE CLOCK signal through inverter 75d. The Q outputs of flip flops 75a and 75b are also coupled to the inputs of an exclusive-NOR gate 75c (active-low exclusive-OR).

In operation, flip flop 75a goes high on the rising edge of the STROBE CLOCK signal when the DELAYED STROBE ENABLE signal is asserted. Flip flop 75b is initially low, and thus, the output of gate 75c will be low. Upon the falling edge of the STROBE CLOCK, flip flop 75b will latch the high Q output of flip flop 75b, and the output of gate 75c will go high. Upon the next rising edge of the STROBE CLOCK, flip flop 75a will output low, resulting in a low output for gate 75c. On the next falling edge, flip flop 75b will latch the low Q output of flip flop 75a and state 75c will output high. The gate will continue to provide an oscillating signal in this manner as long as the DELAYED STROBE ENABLE signal is asserted.

It may be necessary to add delays (e.g. delays 75e and 75f) at the outputs (or alternatively, at the inputs) of one or both flip flops 75a or 75b to vary the duty cycle of the resulting $\overline{CAS}$ signal. In particular, the output signal of either flip flop may be shifted relative to the other through the use of one or both of these delays, e.g., to provide a 50% duty cycle signal.

The preferred system controller 50 generates control signals for controlling the system memory in response to a memory access request as follows. First, as shown in FIG. 4, a memory access request is received from processor 20 across system bus 25, and passes through host bus control block 52 and arbitration control block 56, which decode and pass the necessary information pertaining to the access request to memory control block 60. Then, as shown in FIG. 5, this access request information is passed to memory control state machine 65, which generates the control signals for coordinating the transfer of information with memory 40. The $\overline{WE}$, MEM ADDR, and $\overline{RAS}$ control signals are generated in a manner which is known in the art. However, to generate the $\overline{CAS}$ signal, memory control state machine 65 generates a suitable STROBE ENABLE signal (which has a duration of one or four clock cycles depending upon whether the access is a normal or burst mode access) which is passed to the strobe generating circuit 70 to generate the $\overline{CAS}$ signal.

Figure 9:
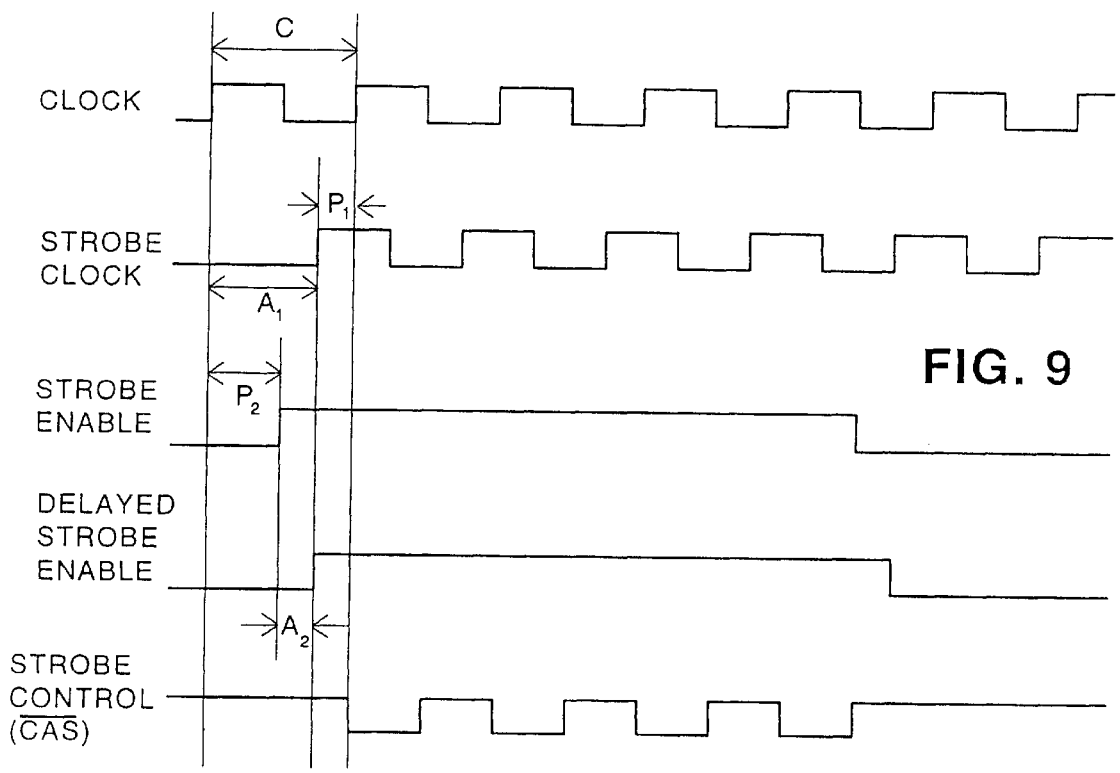
FIG. 9 is a timing diagram illustrating the operation of the strobe generating circuit of FIG. 6.

For example, FIG. 9 is a timing diagram which illustrates the sequence of operations in generating a burst mode access $\overline{CAS}$ signal. First, the strobe clock generating circuit 72 generates a STROBE CLOCK signal which is delayed by programmable delay 74 by an amount which is set by the first delay count.

The STROBE CLOCK signal must be delayed by a first delay count which represents a first alignment delay value $A_1$ that is necessary to align the STROBE CONTROL signal with the bus (or specifically, the CLOCK signal at the memory devices. The desired first alignment delay value $A_1$ is generally equal to the clock cycle time C less the first propagation delay value $P_1$.

As discussed above, the propagation delay value $P_1$ represents the total delay or skew associated with. generating the STROBE CONTROL signal from the STROBE CLOCK signal and outputting it to the memory devices. Typically, this value will include the delay associated with output gate 75, as well as any transmission delays between the output gate and the memory devices, including any buffers or other circuitry disposed between the system controller and memory devices. It is desirable to delay the STROBE CLOCK signal such that, when the STROBE CONTROL signal is received at each of the memory devices in memory 40, it is substantially aligned with the CLOCK signal, and therefore also with bus 25. Accordingly, it is important to include any delays located downstream of delay 74 so that the signal is properly aligned.

Second, as discussed above, a STROBE ENABLE signal will be generated by state machine 65. This signal will have a second propagation value $P_2$ associated therewith which is due to the delay or skew which is a result of the state machine generating the signal, and will have a duration of four clock cycles. The delayed strobe enable generating circuit 76 therefore delays the STROBE ENABLE signal by a second alignment delay value representative of the second delay count stored in register 77. The second alignment delay value $A_2$ is selected to align the DELAYED STROBE ENABLE signal with the STROBE CLOCK signal at the inputs of the output gate 75, which is generally equal to the clock cycle time C less the second propagation delay value associated with outputting the strobe enable signal. The second propagation delay value represents the total. propagation delay for the signal, which is $P_1$ plus $P_2$ since the delay associated with gate 75 and any other delays downstream thereof also need to be accounted for.

Therefore, as shown in FIG. 9, the STROBE CLOCK signal and the DELAYED STROBE ENABLE signal are substantially aligned with one another, and are out of alignment with the CLOCK signal by a time period represented by the first propagation delay value $P_1$. Then, after the signals are passed through output gate 75 and are transmitted to the memory devices, the resulting STROBE CONTROL ($\overline{CAS}$) signal seen at the inputs to the memory devices is as shown in FIG. 8. It will be noted that the STROBE CONTROL signal is active low and substantially aligned with the CLOCK signal.

An alternative manner to create an active low STROBE CONTROL signal is to create an active low STROBE CLOCK signal in lieu of that as shown in FIG. 8. This would be performed by delaying the STROBE CLOCK signal a time value of ½ of the clock cycle (0.5×C) less the first propagation delay value $P_1$, such that the signal is an inverted version of the CLOCK signal after being delayed.

Returning to FIG. 6, in order for the $\overline{CAS}$ signal to be aligned with the CLOCK signal, suitable delay count values must be stored in registers 73 and 77 of strobe generating circuit 70. The delay count values will vary from chip set to chip set due to variations in the process factor for the materials used in each chip set. In addition, the delay values necessary to properly align the signals may vary depending upon voltage and temperature differences. The process factor of a chip set, and the effects of voltage and temperature, may be combined into a single "delay factor" for the chip which is representative of the relative speed of the chip due to these factors.

Accordingly, a delay factor determining circuit 80 as shown in FIG. 5 is used to generate a delay factor from which proper delay count values may be determined and stored in the registers in the strobe generating circuit. Delay factor determining circuit 80 communicates with memory control state machine 65 by receiving an ADJUST ENABLE signal, and by transmitting an ALIGNED signal thereto. Circuit 80 also includes lines for communicating with configuration block 58, and further has an input for the CLOCK signal. Finally, circuit 80 provides an-ADJUST output to strobe generating circuit 70 to adjust the values stored in the registers in circuit 70.

Figure 10:
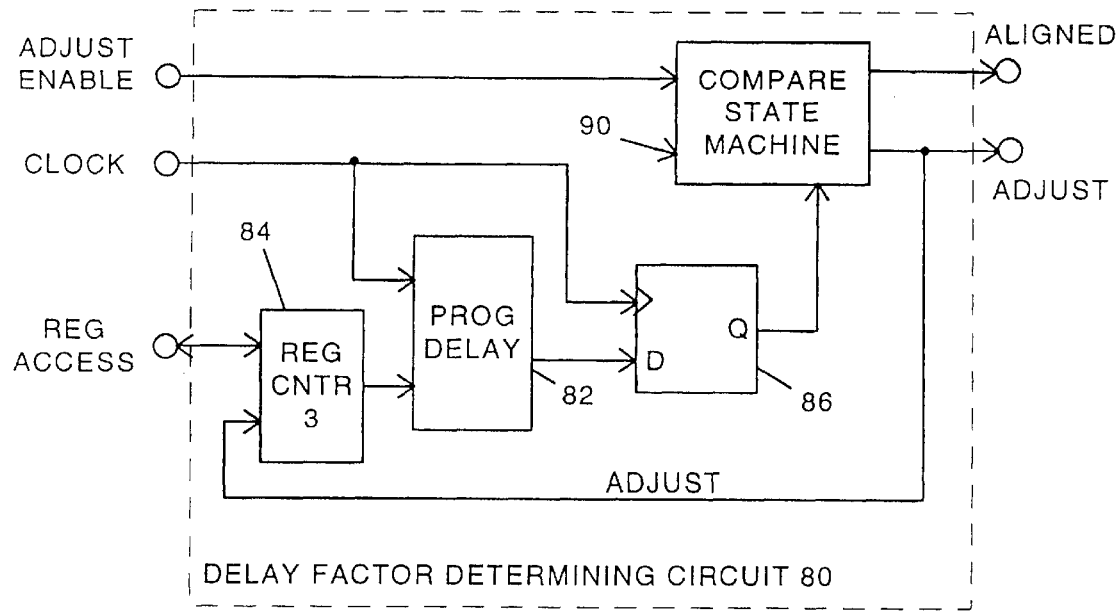
FIG. 10 is a functional block diagram of the delay factor determining circuit of FIG. 5.

Delay factor determining circuit 80 is shown in greater detail in FIG. 10. Circuit 80 receives a CLOCK input which is fed both to a programmable delay 82 and to the edge triggered clock input for a D-type flip flop 86

Programmable delay 82 is preferably the same design as programmable delays 74 and 78 in strobe generating circuit 70, including a plurality of delay elements connected in series, with their respective outputs connected through a common multiplexer. Alternatively, to reduce the number of components on an integrated circuit, it may be desirable for programmable delay 82 to simply use the same series connection of delay elements 74a from programmable delay 74 of FIG. 7. Delay 82 may then be implemented using only an additional multiplexer which is coupled in parallel with multiplexer 74b of delay 74 (i.e., with the inputs to the multiplexers coupled in parallel to the outputs of the delay elements. Since both delays 74 and 82 include a data input which receives the CLOCK signal, both may use the same chain of delay elements, yet still provide separately delayed signals by selecting different outputs to pass through their respective multiplexers.

Returning to FIG. 10, programmable delay 82 receives a third delay count value from a third register counter 84. In addition, the programmable delay has its output connected to the D input of flip flop 86.

Register counter 84 includes a plurality of register access signals for communicating with the processor through configuration block 58. Register counter 84 is similarly configured to registers 73 and 77 of circuit 70, being countable up or down through an ADJUST input (typically separate INC and DEC lines), which in the case of register counter 84 is received from a compare state machine 90, which controls the overall operation of delay factor determining circuit 80.

Compare state machine 90 receives an ADJUST ENABLE signal from memory control state machine 65, as well as the Q output from flip flop 86. State machine 90 also outputs an ALIGNED signal to indicate to state machine 65 when the clocks are aligned, as well as an ADJUST signal which is used to control the register counters to properly align the various signals in the system.

Through the use of state machine 90, circuit 80 is capable of performing two primary functions. First, during a start-up period, circuit 80 calculates a delay factor for the integrated circuit, which is subsequently accessed by the processor to determine the delay count values to store in registers 73 and 77 in strobe generating circuit 70. A second function, which occurs periodically during the normal operation of the system, is a dynamic realignment of the clock to account for any temperature or voltage variation. This second function is initiated by memory control state machine 65 asserting the ADJUST ENABLE signal, which is typically performed when there are no memory accesses being performed in the system.

Figure 11:
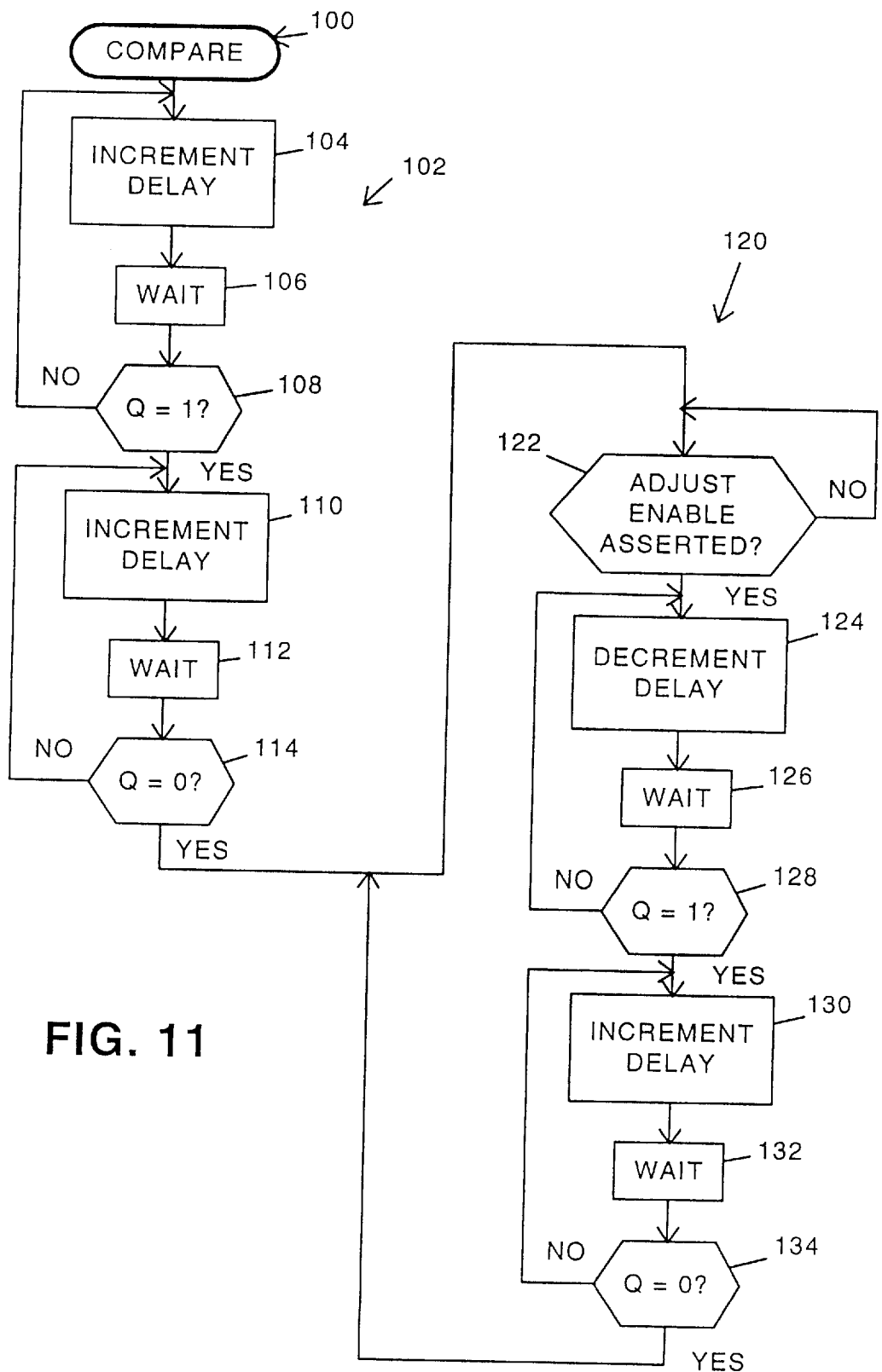
FIG. 11 is a flow chart showing the operation of the compare state machine of FIG. 10.

The operation of compare state machine 90 is illustrated in greater detail in FIG. 11. Compare state machine 90 operates via a compare algorithm 100 which includes a first, start-up determining routine 102 for calculating the initial delay factor and a second, adjust routine 120 that operates in real time to adjust the delay count values in response to temperature and voltage variations.

First, regarding the start-up routine 102, it will be appreciated that upon start-up all of the registers 73, 77 and 84 will be set at zero by a hard reset which occurs during initialization of the circuit. Routine 102 basically operates by incrementing the value stored in register 84 to successively add delay elements to a delayed version of the CLOCK signal until the delayed version is realigned with the original CLOCK signal. To perform this function, routine 102 follows a first loop including blocks 104, 106 and 108. In block 104, the adjust signal is asserted to increment the value in register 84 (typically by asserting an INC signal). Then, in block 106, the state machine waits a predetermined period of time, typically about 1 to 2 microseconds, to allow the system to stabilize. Then, in block 108, the output of flip flop 86 is analyzed to determine whether it has been asserted from an initial "zero" state. When this occurs, this indicates that the delayed version of the CLOCK signal is precisely delayed one-half of the period of the CLOCK signal, since a zero to one transition in the Q output will occur at precisely this point. If this point has not been reached, block 108 cycles back to block 104 to again increment the value in register 84 and thereby add another delay element to the delayed version of the CLOCK signal.

However, if the transition is detected, control passes to block 110 to again increment the delay, then wait in block 112 a period of time sufficient to allow the system to stabilize. Then, in block 114, a one to zero transition of the Q output at flip flop 86 is determined in block 114. This transition from one to zero will indicate the precise time at which the delayed version of the CLOCK is realigned with the CLOCK signal.

Figure 12A:
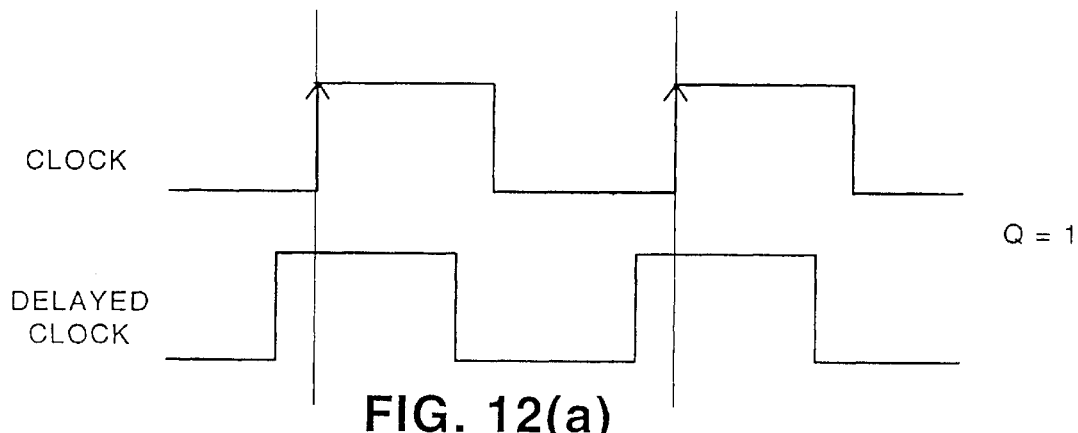
FIGS. 12(a) and 12(b) are timing diagrams illustrating the clock alignment procedure for the delay factor determining circuit of FIG. 10.
Figure 12B:
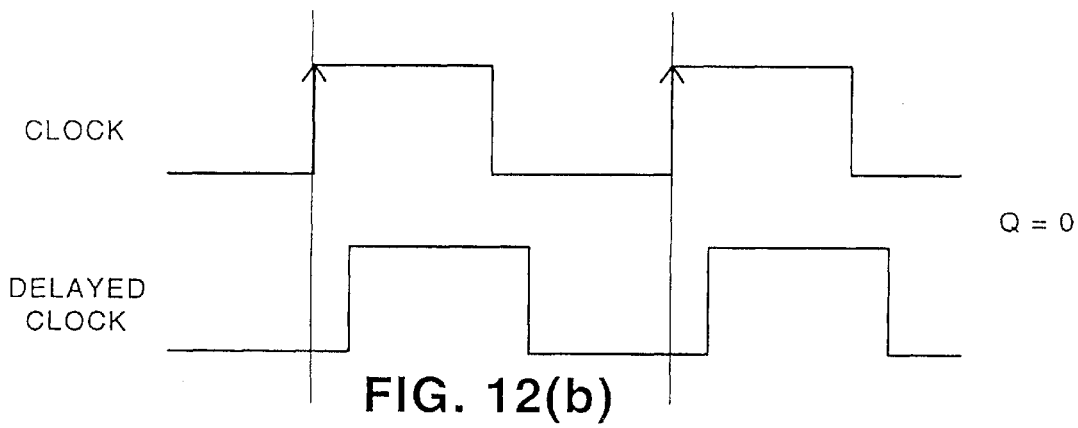

FIGS. 12(a) and 12(b) illustrate a one to zero transition of the Q output of flip flop 86. For example, in FIG. 12(a), the rising edge of the DELAY CLOCK signal is slightly ahead in time relative to the rising edge of the CLOCK signal. Since the output of flip flop 86 will be latched upon the rising edge of the CLOCK signal, the output of the flip flop will therefore be high in this situation. Then, when an additional delay element has been added to the DELAY CLOCK such that the rising edge of the DELAY CLOCK is lagging behind that of the CLOCK signal (as illustrated in FIG. 12(b)), the output of flip flop 86 will be low by virtue of the low value for the DELAY CLOCK upon the rising edge of the CLOCK signal.

Returning to FIG. 11, when the one to zero transition of the output of flip flop 86 has occurred, compare state machine 90 may simply enter a "sleep" mode, with the number of delay elements necessary to realign the delayed CLOCK signal with the CLOCK signal being stored in register counter 84.

Figure 13:
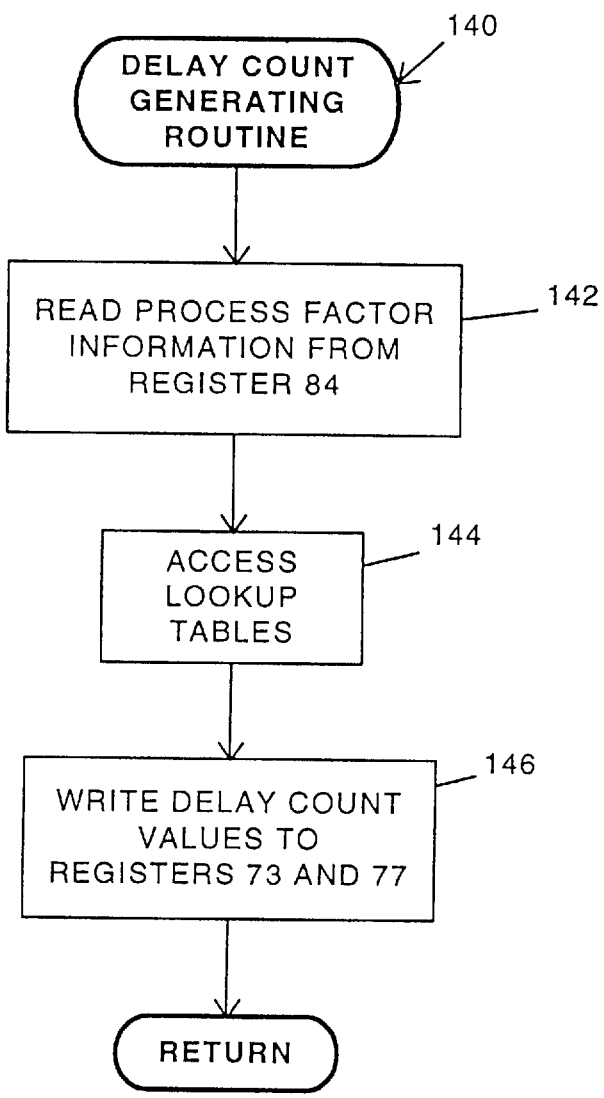
FIG. 13 is a flow chart showing the operation of the delay count generating routine implemented on the processor of FIG. 3.

With the delay elements stored within this register, the processor may access the value stored in register 84, and from this information may determine suitable delay count values to store in registers 73 and 77. For example, as shown in FIG. 13, a software implemented delay count generating routine 140 may be executed in processor 20 of FIG. 3. The preferred routine 140 basically operates by first initiating a read operation in block 142 to obtain the value stored in register 84 across bus 25. The read operation will typically consist of a standard read access across the bus, with a specific memory address corresponding to register 84. Configuration block 58 shown in FIG. 4 thus will include suitable logic to decode the specific address for register 84, and handle the read request to thereby pass the value stored in register counter 84 over the bus to processor 20. The memory access protocols for handling a read operation across a bus are well known within the art. Consequently, the design of configuration block 58 is conventional in nature and would be apparent to one skilled in the art.

Once processor 140 has obtained the value stored in register 84, control preferably proceeds to block 144 to access a pair of look-up tables which contain the corresponding first and second delay count values to store, respectively, in registers 73 and 77 in strobe generating circuit 70. The data in the look-up tables may be generated empirically or through simulation, since the amount of delay associated with generating and outputting the STROBE CLOCK and the DELAYED STROBE ENABLE signals may be reliably modeled in a conventional manner. The resulting outputs of the look-up tables should be the delay count values necessary to properly align the DELAYED STROBE ENABLE and STROBE CLOCK signals as described above such that a suitable $\overline{CAS}$ signal is output by the system controller. The values in the look-up tables will of course vary upon the particular circuitry and propagation delays associated therewith, and thus will not be discussed further herein.

Alternate means of determining the first and second delay count values from the process factor information stored in register 84 may also be used. For example, there may simply be a linear relationship between the process factor and the delay count values in some applications. Accordingly, block 144 may instead simply be a scaling operation for calculating the delay count values. Other mathematical relationships may exist between the process factor information and the delay count values in some applications, and therefore it is believed that suitable mathematical formulas may be used to generate the delay count values from this information.

Returning to FIG. 13, once the delay count values are determined in block 144, control then passes to block 146 to write these values to registers 73 and 77 across bus 25. As with register 84, registers 73 and 77 are preferably accessed via unique memory addresses, with configuration block 58 assisting in the transferring of the delay count values across bus 25 to registers 73 and 77.

Routine 140 may be implemented as part of the basic initialization routine performed by processor 20 during a start-up or reset operation. Accordingly, these routines are preferably implemented in the BIOS for processor 20. Alternatively, the determination and storing of delay count values in registers 73 and 77 may be implemented in a suitable state machine or other logic circuitry within system controller 50.

Returning to FIG. 11, delay factor determining circuit 80 performs a second function of adjusting the values stored in registers 73 and 77 to compensate for any temperature or voltage variations that occur during the normal operation of the system. This additional function is implemented in routine 120, which will execute whenever the ADJUST ENABLE signal is asserted from memory control state machine 65. In this routine, control first passes to block 124 to decrement the delay value set in register 84, typically by asserting a DEC signal as a component of the ADJUST signal. This will have the effect of decrementing register counter 84, as well as register counters 73 and 77 which operate in a similar manner.

Next, in block 126, several wait states are inserted to enable the system to settle, then a zero to one transition is detected in block 128. If the output of flip flop 86 is low, control passes back to block 124 to decrement the delay again. However, if a zero to one transition is detected, control passes to the loop of blocks 130–134 to successively increment the delay, wait until the system has settled, and look for a one to zero transition in the output of flip flop 86. Once this transition is detected, the delay clock should again be aligned with the clock. Moreover, since registers 73 and 77 are coupled to the same ADJUST signals as register 84, the delay count values stored in these registers should be updated in a similar manner to thereby concurrently realign their respective signals.

Routine 120 essentially operates by "backing up" the DELAY CLOCK until it is again leading the CLOCK signal, then advancing the DELAY CLOCK until it slightly lags the CLOCK signal in the same manner that the original process factor was calculated in routine 102. Referring to FIGS. 12(a) and 12(b), the one to zero transition generated and detected in blocks 124–128 represents a decrease in the number of delay elements backing up the DELAY CLOCK signal shown in FIG. 12(b) to the position shown in FIG. 12(a). Conversely, the routine in blocks 130–134 advances the DELAY CLOCK signal, i.e., from the position shown in FIG. 12(a) to the position shown in FIG. 12(b). Consequently, by virtue of routine 120, the DELAY CLOCK is realigned, and the corresponding corrections are made to the first and second delay count values stored respectively in registers 73 and 77. Alternatively, the registers may be reset and routines 102 and 140 re-executed on a periodic basis to simply re-compute the delay count values.

Routine 120 is preferably executed on a periodic basis by memory control state machine 65, and preferably whenever no memory transfers are occurring in the system controller. Preferably, the adjust routine will occur approximately every 1 to 2 milliseconds. However, it will be appreciated that the routine may be run more or less frequently. The configuration of memory control state machine 65 to periodically execute this routine is conventional in nature and is well understood by one skilled in the art.

Delay factor determining circuit 80 and routine 140 implemented in processor 20 together form a delay control circuit which stores and maintains suitable delay count values in registers 73 and 77 to provide proper alignment of the $\overline{CAS}$ signal output by the system controller. It will be appreciated that the various functions implemented in this circuit may be allocated wholly or partly to the processor, the system controller, or even to a separate control circuit, as an alternative to the preferred processor/system controller implementation discussed here.

Therefore, it will be seen that the invention provides unique advantages in terms of providing low-skew control signals and thereby permitting significant advantages in terms of reliability and speed. As various modifications may be made to the preferred embodiments within the spirit and scope of the invention, the invention therefore lies in the claims hereinafter appended.

What is claimed is:

1. A device for aligning a strobe control signal and a clock signal, both received by a memory, comprising:

(a) a delay control circuit for determining a delay factor related to the speed of the device and for generating a first delay value and a second delay value from the delay factor;

(b) a control circuit for generating a strobe enable signal in response to a memory access request from a processor; and (c) a strobe control generating circuit for delaying the clock signal by the first delay value to generate a strobe clock signal, delaying the strobe enable signal by the second delay value to generate a delayed strobe enable signal, and gating the strobe clock signal with the delayed strobe enable signal to provide the strobe control signal to the memory.

2. The device of claim 1 wherein the delay control circuit comprises:

(a) an adjustable delay for delaying the clock signal by a third delay value, and (b) a compare circuit for adjusting the adjustable delay until the clock signal and the delayed clock signal are aligned.

3. The device of claim 2 wherein the compare circuit includes a start-up routine for selectively incrementing the third delay value until the clock signal and the delayed clock signal are aligned.

4. The device of claim 3 wherein the third delay value is stored in a delay control circuit register electrically coupled to the select input of the adjustable delay and wherein the delay factor is related to the third delay value when the clock signal and the delayed clock signal become aligned.

5. The device of claim 4, wherein the processor accesses the third delay value stored in the delay control circuit register to determine the first and second delay values.

6. The device of claim 5, wherein the processor determines the first and second delay values by accessing a look-up table of first and second delay values indexed by the third delay value.

7. The device of claim 5, wherein the processor determines the first and second delay values by scaling the third delay value with first and second scaling constants.

8. The device of claim 5, wherein the compare circuit includes an adjust routine for adjusting the first and second delay values in response to temperature and voltage variations.

9. The device of claim 8, wherein the adjust routine periodically realigns the delayed clock signal with the clock signal by selectively applying an adjust signal to the delay control circuit register to adjust the third delay value, whereby adjusting the third delay value likewise adjusts the first and second delay values.

10. A device for aligning a control signal and a clock signal, both received by a memory, comprising:

(a) a delay control circuit for determining a delay factor and for generating a first delay value and a second delay value from the delay factor;

(b) a control circuit for generating an enable signal in response to a memory access request; and (c) a strobe control generating circuit for delaying the clock signal by the first delay value to generate a second clock signal, delaying the enable signal by the second delay value to generate a delayed strobe enable signal, and gating the second clock signal with the delayed enable signal to provide the control signal to the memory.

* * * * *

UNITED STATES PATENT AND TRADEMARK OFFICE
CERTIFICATE OF CORRECTION

PATENT NO. : 5,819,076
DATED : October 6, 1998
INVENTOR(S) : Jeddeloh et al.

It is certified that error appears in the above-indentified patent and that said Letters Patent is hereby corrected as shown below:

Column 11, line 65, reads "output 9 such", should read --output such--

Column 13, line 11, reads "with.generating", should read --with generating--

Column 13, line 39, reads "total.propagation", should read --total propagation--

Column 14, line 16, reads "an-ADJUST", should read --an ADJUST--

Column 14, line 22, reads "flip flop 86", should read --flip flop 86.--

Column 16, line 40, reads "scaling.operation", should read --scaling operation--

Signed and Sealed this

Fifth Day of October, 1999

Attest:

Q. TODD DICKINSON

Attesting Officer

Acting Commissioner of Patents and Trademarks